(12) United States Patent
Hardiman et al.

(10) Patent No.: US 10,840,162 B2
(45) Date of Patent: *Nov. 17, 2020

(54) SEMICONDUCTOR DIE WITH IMPROVED RUGGEDNESS

(71) Applicant: Cree, Inc., Durham, NC (US)

(72) Inventors: Chris Hardiman, Morrisville, NC (US); Kyoung-Keun Lee, Cary, NC (US); Fabian Radulescu, Chapel Hill, NC (US); Daniel Namishia, Wake Forest, NC (US); Scott Thomas Sheppard, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/400,109

(22) Filed: May 1, 2019

(65) Prior Publication Data

US 2019/0259682 A1 Aug. 22, 2019

Related U.S. Application Data

(63) Continuation of application No. 15/828,539, filed on Dec. 1, 2017, now Pat. No. 10,332,817.

(51) Int. Cl.
*H01L 23/48* (2006.01)
*H01L 23/52* (2006.01)
*H01L 23/31* (2006.01)
*H01L 29/06* (2006.01)
*H01L 21/56* (2006.01)
(Continued)

(52) U.S. Cl.
CPC ......... *H01L 23/3171* (2013.01); *H01L 21/56* (2013.01); *H01L 23/3192* (2013.01); *H01L 23/53209* (2013.01); *H01L 24/06* (2013.01); *H01L 29/0607* (2013.01);
(Continued)

(58) Field of Classification Search
USPC ....................................................... 257/782
See application file for complete search history.

(56) References Cited

U.S. PATENT DOCUMENTS 9,812,338 B2 11/2017 Ring et al.
9,934,983 B2 4/2018 Ring et al.
(Continued)

OTHER PUBLICATIONS

Non-Final Office Action for U.S. Appl. No. 15/828,539, dated Nov. 1, 2018, 8 pages.
(Continued)

*Primary Examiner* — Niki H Nguyen
(74) *Attorney, Agent, or Firm* — Withrow & Terranova, P.L.L.C.

(57) ABSTRACT

A semiconductor die includes a substrate, a first passivation layer over the substrate, and a second passivation layer over the first passivation layer and the substrate. The substrate has boundaries defined by a substrate termination edge. The first passivation layer is over the substrate such that it terminates at a first passivation termination edge that is inset from the substrate termination edge by a first distance. The second passivation layer is over the first passivation layer and the substrate such that it terminates at a second passivation termination edge that is inset from the substrate termination edge by a second distance. The second distance is less than the first distance such that the second passivation layer overlaps the first passivation layer.

21 Claims, 14 Drawing Sheets

(51) Int. Cl.
*H01L 23/532* (2006.01)
*H01L 23/00* (2006.01)
*H01L 29/20* (2006.01)

(52) U.S. Cl.
CPC ...... *H01L 29/0638* (2013.01); *H01L 29/2003* (2013.01); *H01L 2224/0391* (2013.01)

(56) References Cited

U.S. PATENT DOCUMENTS

| | | |
|---|---|---|
| 9,972,572 B2 | 5/2018 | Hoshi |
| 9,991,399 B2 | 6/2018 | Mieczkowski et al. |
| 10,332,817 B1 * | 6/2019 | Hardiman ........... H01L 23/3192 |
| 2010/0025820 A1 | 2/2010 | Suekawa |
| 2014/0264960 A1 | 9/2014 | Ring et al. |
| 2014/0299887 A1 | 10/2014 | Matocha et al. |
| 2014/0299890 A1 * | 10/2014 | Matocha ............... H01L 21/045 257/77 |
| 2015/0162349 A1 | 6/2015 | Byeon et al. |
| 2015/0214164 A1 | 7/2015 | Matocha et al. |
| 2015/0221574 A1 | 8/2015 | Ring et al. |
| 2015/0303260 A1 | 10/2015 | Niedernostheide et al. |
| 2016/0093748 A1 | 3/2016 | Mieczkowski et al. |
| 2018/0138272 A1 | 5/2018 | Ebihara et al. |
| 2018/0358433 A1 * | 12/2018 | Su ....................... H01L 29/0623 |
| 2019/0172769 A1 | 6/2019 | Hardiman et al. |

OTHER PUBLICATIONS

Notice of Allowance for U.S. Appl. No. 15/828,539, dated Feb. 13, 2019, 9 pages.

International Search Report and Written Opinion for International Patent Application No. PCT/US2018/058836, dated Jan. 22, 2019, 15 pages.

International Preliminary Report on Patentability for International Patent Application No. PCT/US2018/058836, dated Jun. 11, 2020, 9 pages.

* cited by examiner

SEMICONDUCTOR DIE WITH IMPROVED RUGGEDNESS

RELATED APPLICATION

The present application is a continuation of U.S. patent application Ser. No. 15/828,539, filed Dec. 1, 2017, now U.S. Pat. No. 10,332,817, the disclosure of which is hereby incorporated herein by reference in its entirety.

FIELD OF THE DISCLOSURE

The present disclosure is related to semiconductor devices, and in particular to semiconductor devices with increased ruggedness and methods for making the same.

BACKGROUND

Numerous semiconductor devices can be fabricated together on a semiconductor die. For purposes of illustration, FIG. 1 shows a conventional semiconductor die 10. The conventional semiconductor die 10 includes a substrate 12, a first passivation layer 14 over the substrate 12, a second passivation layer 16 over the first passivation layer 14, a third passivation layer 18 over the second passivation layer 16, and a number of contact pads 20. The boundaries of the substrate 12 are defined by a substrate termination edge 22. The substrate 12 includes an active area 24 in which a number of semiconductor devices (not shown) may be provided, for example, by one or more implanted regions and one or more metallization layers, and a barrier region 26 around the active area 24. The barrier region 26 electrically isolates the active area 24 from the substrate termination edge 22 and thus the surrounding environment. The barrier region 26 is generally provided as an implant that reduces the conductivity of the substrate 12, but can also be an etched mesa or shallow trench isolation (STI). Normally, the barrier region 26 extends from an inside barrier region termination edge 28 to the substrate termination edge 22, forming a barrier around the perimeter of the conventional semiconductor die 10.

The first passivation layer 14 is provided over the active area 24 and extends over the barrier region 26 to a passivation termination edge 30. The second passivation layer 16 is over the first passivation layer 14 and similarly extends to the passivation termination edge 30. The third passivation layer 18 is over the second passivation layer 16 and similarly extends to the passivation termination edge 30. The contact pads 20 may be provided on the second passivation layer 16 and be exposed to the outside environment via one or more openings in the third passivation layer 18. While not shown, metallization layers within the first passivation layer 14 and the second passivation layer 16 may couple the contact pads to one or more semiconductor devices in the active area 24. The passivation termination edge 30 is inset from the substrate termination edge 22 by a certain distance D.

The first passivation layer 14, the second passivation layer 16, and the third passivation layer 18 are provided to isolate the semiconductor devices in the active area 24 from the surrounding environment, both electrically and physically. However, when the conventional semiconductor die 10 is in a humid environment and subject to high temperatures and/or bias voltages, one or more of the first passivation layer 14, the second passivation layer 16, and the third passivation layer 18 may delaminate from their underlying layer, allowing moisture to penetrate into the active area 24. This may cause failure of the conventional semiconductor die 10. This problem is exacerbated by an electric field created by operating one or more semiconductor devices in the active area 24, which may be quite high at the passivation termination edge 30. This electric field may draw moisture from the passivation termination edge 30 towards the active area 24 and thus cause failure of the conventional semiconductor die 10 as discussed above.

In light of the above, there is a need for a semiconductor die with improved ruggedness and methods for manufacturing the same.

SUMMARY

The present disclosure is related to semiconductor devices, and in particular to semiconductor devices with increased ruggedness and methods for making the same. In one embodiment, a semiconductor die includes a substrate, a first passivation layer over the substrate, and a second passivation layer over the first passivation layer and the substrate. The substrate has boundaries defined by a substrate termination edge. The first passivation layer is over the substrate such that it terminates at a first passivation termination edge that is inset from the substrate termination edge by a first distance. The second passivation layer is over the first passivation layer and the substrate such that it terminates at a second passivation termination edge that is inset from the substrate termination edge by a second distance. The second distance is less than the first distance such that the second passivation layer overlaps the first passivation layer. By overlapping the second passivation layer and the first passivation layer, the ruggedness of the semiconductor die can be significantly increased, since moisture can be prevented from penetrating the first passivation layer and the second passivation layer.

In one embodiment, a method for manufacturing a semiconductor die includes the steps of providing a substrate, providing a first passivation layer over the substrate, and providing a second passivation layer over the first passivation layer. The substrate has boundaries defined by a substrate termination edge. The first passivation layer is over the substrate such that it terminates at a first passivation termination edge that is inset from the substrate termination edge by a first distance. The second passivation layer is provided over the first passivation layer and the substrate such that it terminates at a second passivation termination edge that is inset from the substrate termination edge by a second distance. The second distance is less than the first distance such that the second passivation layer overlaps the first passivation layer. By overlapping the second passivation layer and the first passivation layer, the ruggedness of the semiconductor die can be significantly increased, since moisture can be prevented from penetrating the first passivation layer and the second passivation layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
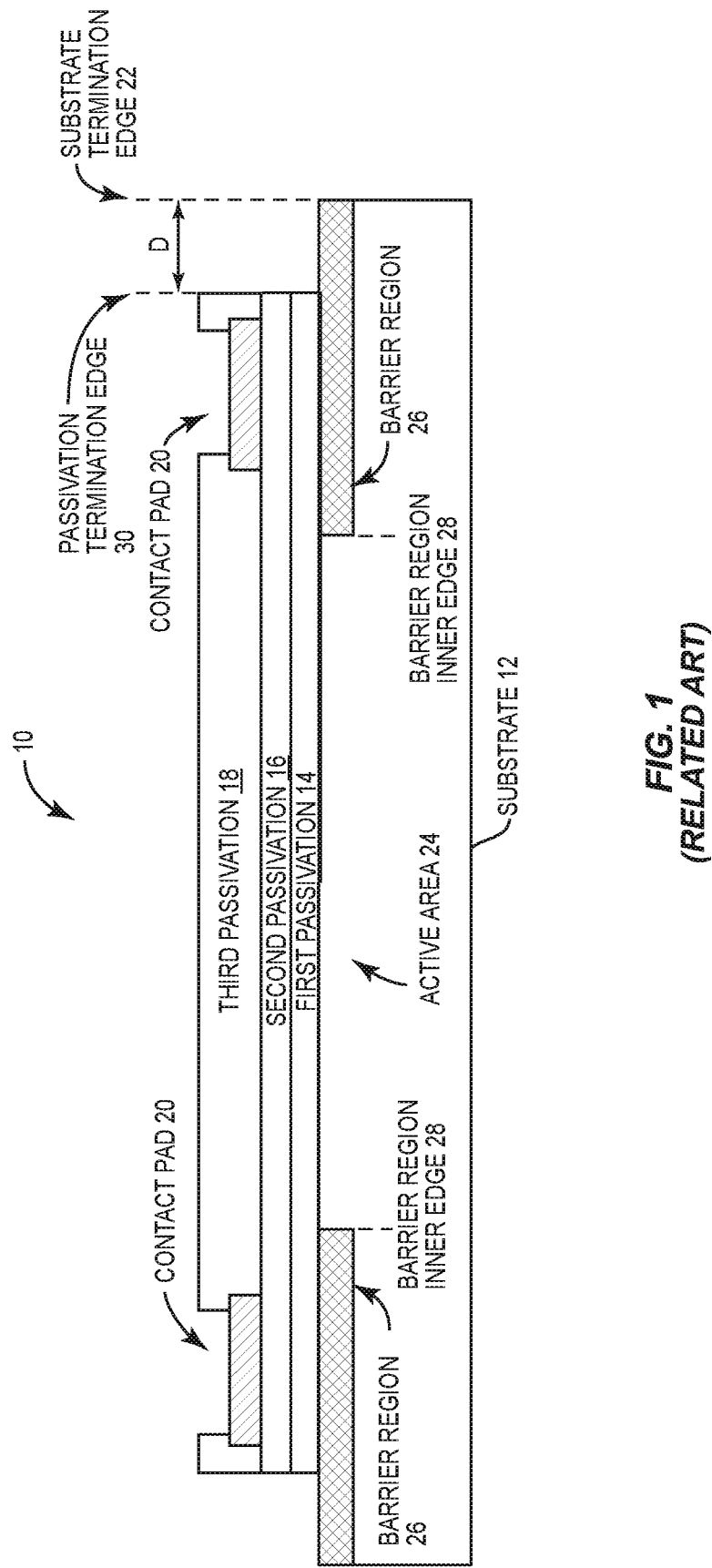
FIG. 1 illustrates a conventional semiconductor die.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
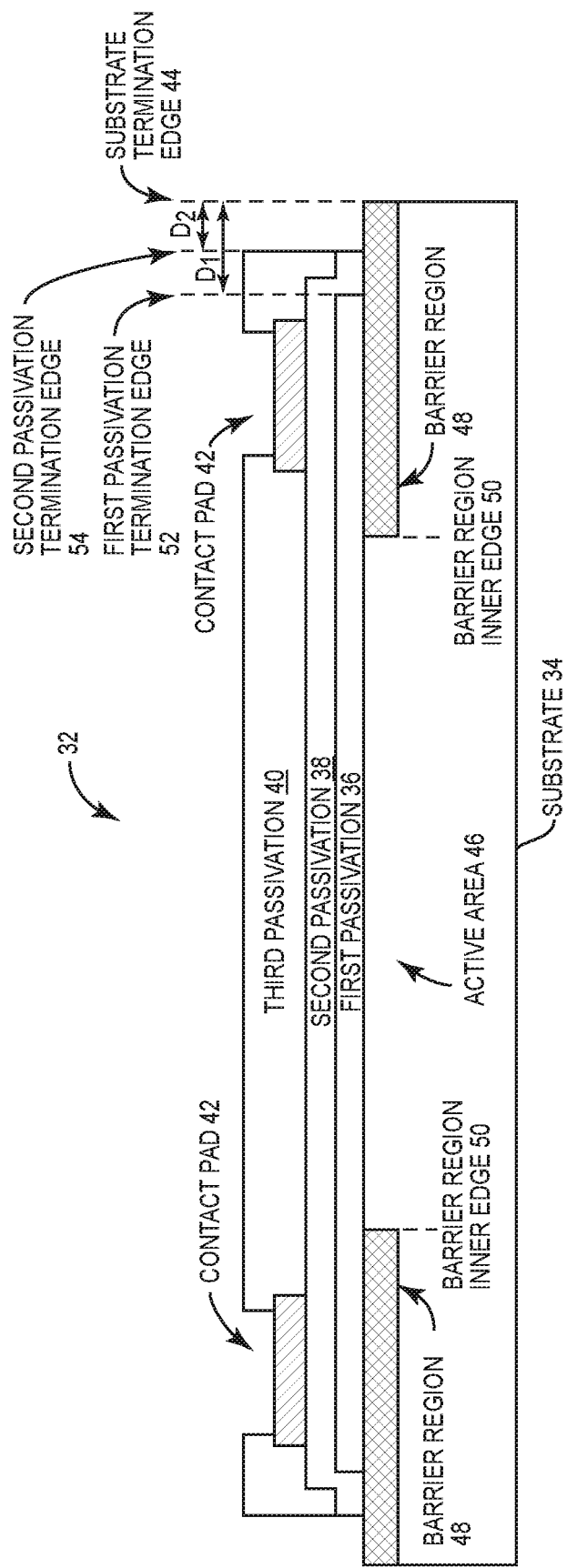
FIGS. 2 through 13 illustrate semiconductor die according to various embodiments of the present disclosure.

FIG. 2 shows a semiconductor die 32 according to one embodiment of the present disclosure. The semiconductor die 32 includes a substrate 34, a first passivation layer 36 over the substrate 34, a second passivation layer 38 over the first passivation layer 36 and the substrate 34, a third passivation layer 40 over the second passivation layer 38, and a number of contact pads 42. The boundaries of the substrate 34 are defined by a substrate termination edge 44. The substrate 34 includes an active area 46 in which a number of semiconductor devices (not shown) may be provided, for example, by one or more implanted regions and one or more metallization layers, and a barrier region 48 around the active area 46. The barrier region 48 electrically isolates the active area 46 from the substrate termination edge 44 and thus the surrounding environment. The barrier region 48 may be provided as an implanted region (e.g., a region of implanted nitrogen, hydrogen, helium, magnesium, zirconium, krypton, argon, and/or iron) that reduces the conductivity of the substrate 34, and may extend from a barrier region inner edge 50 to the substrate termination edge 44. The semiconductor devices may include any type of devices such as diodes, high electron mobility transistors (HEMTs), field-effect transistors (FETs), metal-oxide semiconductor field-effect transistors (MOSFETs), and the like.

The first passivation layer 36 is provided over the active area 46 and extends over the barrier region 48 to a first passivation termination edge 52. The second passivation layer 38 is over the first passivation layer 36 and the substrate 34 and extends to a second passivation termination edge 54. The third passivation layer 40 is over the second passivation layer 38 and similarly extends to the second passivation termination edge 54. The contact pads 42 may be provided on the second passivation layer 38 and be exposed to the outside environment via one or more openings in the third passivation layer 40. While not shown, metallization layers within the first passivation layer 36 and the second passivation layer 38 may couple the contact pads to one or more semiconductor devices in the active area 46.

The first passivation termination edge 52 is inset from the substrate termination edge 44 by a first distance $D_1$. In various embodiments, the first distance $D_1$ may be between 1 μm and 150 μm. The second passivation termination edge 54 is inset from the substrate termination edge 44 by a second distance $D_2$. In various embodiments, the second distance $D_2$ may be between 0.5 μm and 50 μm. Notably, the second distance $D_2$ is less than the first distance $D_1$ such that the second passivation layer 38 and the third passivation layer 40 overlap the first passivation layer 36. Accordingly, the first passivation termination edge 52 is shielded from the surrounding environment by the second passivation layer 38 and the third passivation layer 40. Providing the first passivation layer 36, the second passivation layer 38, and the third passivation layer 40 in this manner increases the ruggedness of the semiconductor die 32 by preventing moisture ingress into the active area 46. In one embodiment, a difference between the first distance $D_1$ and the second distance $D_2$ is greater than 0.5 µm and less than 100 µm. In general, the difference between the first distance $D_1$ and the second distance $D_2$ may be greater than x and less than y. In various embodiments, x may be 1 µm, 2 µm, 3 µm, 4 µm, 5 µm, 6 µm, 7 µm, 8 µm, 9 µm, 10 µm, and up to but not including 50 µm. For any of these embodiments y may be 50 µm, 60 µm, 70 µm, 80 µm, 90 µm, and up to 100 µm.

While only three passivation layers are shown, the principles discussed herein may be applied to any number of passivation layers without departing from the principles of the present disclosure. Further, the first passivation layer 36, the second passivation layer 38, and the third passivation layer 40 may comprise multiple layers themselves. Finally, the principles of the present disclosure may be applied to as little as two passivation layers. That is, the third passivation layer 40 is optional in the embodiment discussed above. Additionally, while the substrate 34 is shown as a single layer, the substrate 34 may include multiple layers (e.g., a carrier layer and one or more epitaxial layers on top of the carrier layer). In these embodiments, the barrier region 48 may be provided through one or more of the epitaxial layers, but not the carrier layer. In one embodiment, the substrate 34 may comprise gallium nitride (GaN). In other embodiments, the substrate 34 may comprise silicon (Si), silicon carbide (SiC), or any other semiconductor material system.

In one embodiment, the first passivation layer 36, the second passivation layer 38, and the third passivation layer 40 comprise stoichiometric and non-stoichiometric formulations of alumina, silica, silicon nitride, silicon oxynitride, silicon dioxide, and/or zirconium oxide. Further, the composition of the first passivation layer 36, the second passivation layer 38, and the third passivation layer 40 may alternate in some embodiments. Separately applying the passivation layers and/or alternating the composition of the passivation layers may reduce the presence of defects (e.g., pinholes) in the layers that traverse more than one of the layers to prevent exposing the active area 46 to the outside environment.

Figure 3:
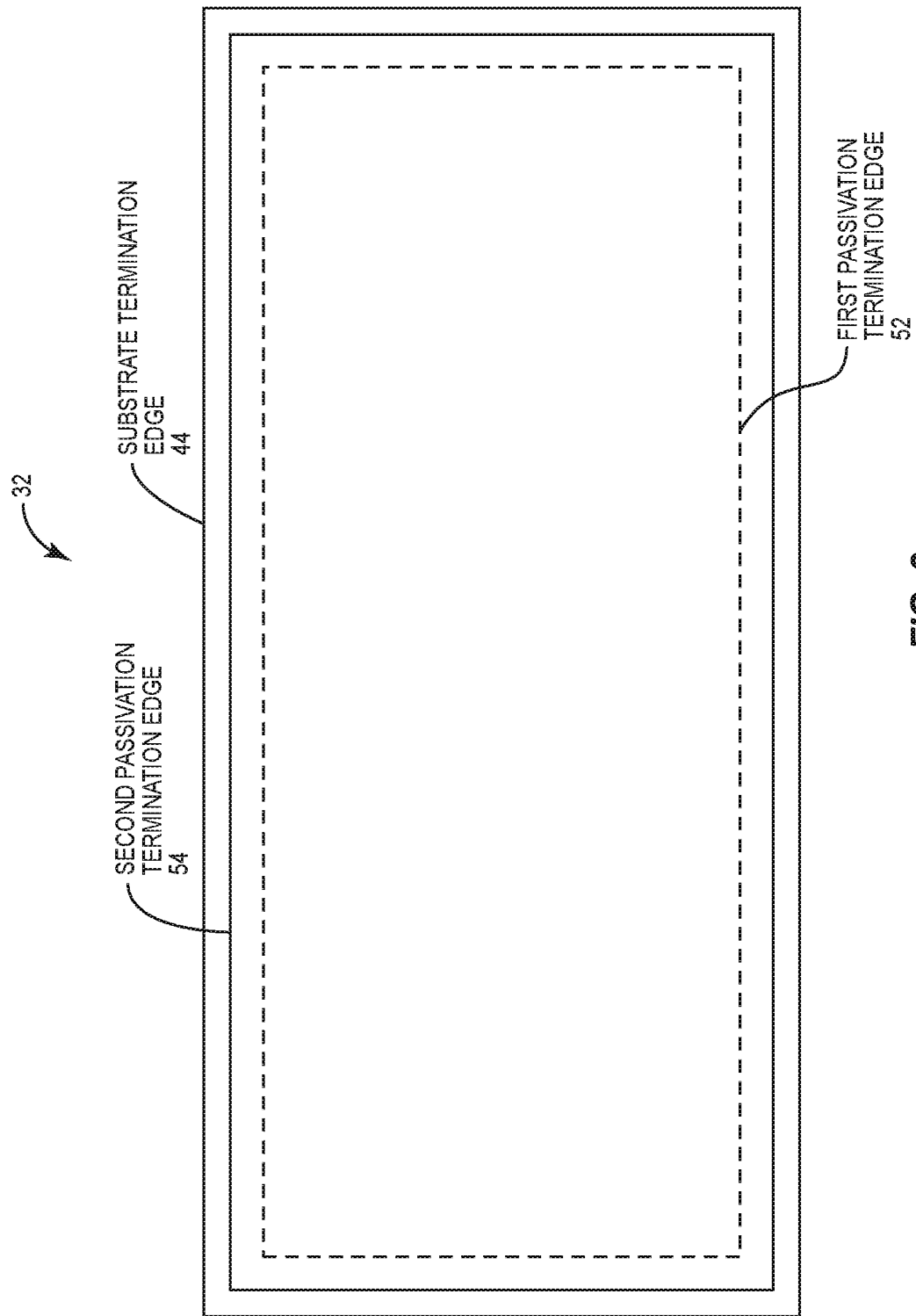

FIG. 3 shows a top-down view of the semiconductor die 32 illustrating the relative positions of the first passivation termination edge 52 and the second passivation termination edge 54 with respect to the substrate termination edge 44 according to one embodiment of the present disclosure. As illustrated, the first passivation termination edge 52 and the second passivation termination edge 54 are inset from the perimeter of the semiconductor die 32 such that the second passivation termination edge 54 is nested inside the substrate termination edge 44 and the first passivation termination edge 52 is nested within the second passivation termination edge 54.

Figure 4:
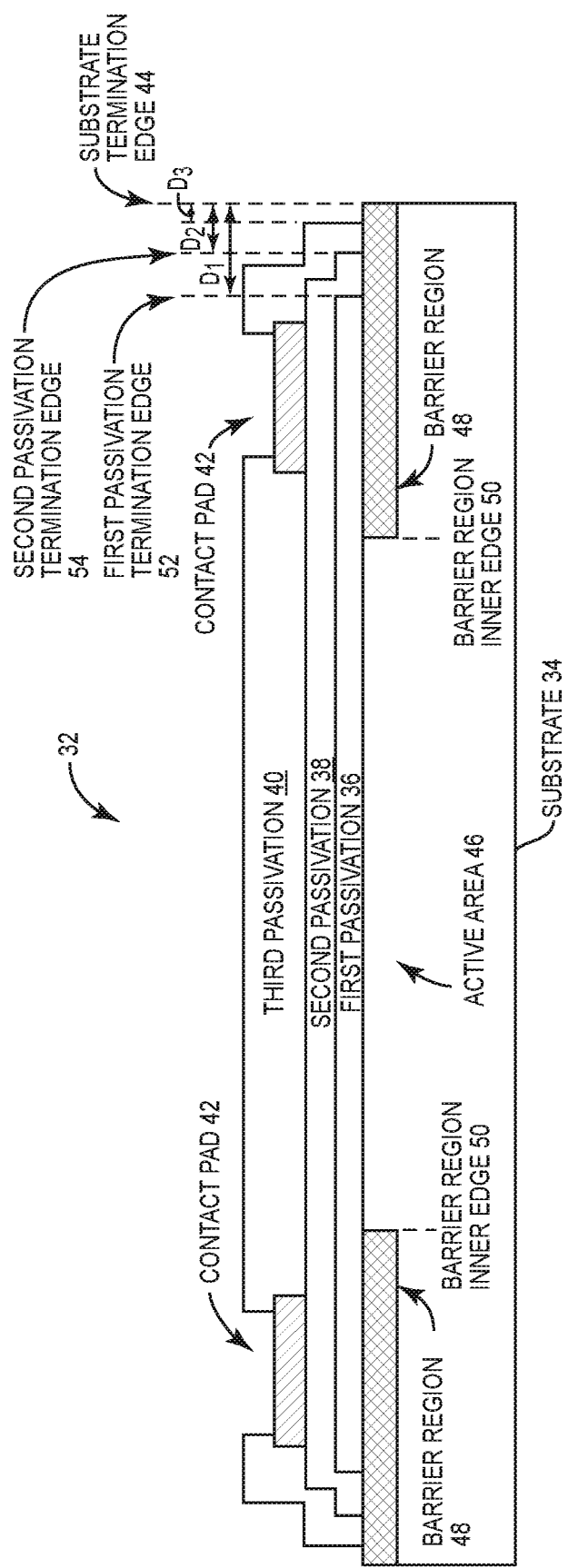

FIG. 4 shows the semiconductor die 32 according to an additional embodiment of the present disclosure. The semiconductor die 32 shown in FIG. 4 is substantially the same as that shown in FIG. 2, except that the third passivation layer 40 in FIG. 4 extends over the second passivation layer 38 to a third passivation termination edge 56, which is inset from the substrate termination edge 44 by a third distance $D_3$. The third distance $D_3$ is less than the second distance $D_2$, such that the third passivation layer 40 overlaps the first passivation layer 36 and the second passivation layer 38. Doing so may further increase the ruggedness of the semiconductor die 32, as it may provide a barrier between the second passivation termination edge 54 and the surrounding environment, and provides an additional barrier between the first passivation termination edge 52 and the surrounding environment. Because the passivation layers may be separately provided and/or alternate in composition, the layers may resist delamination in different conditions, which may prevent moisture ingress over a wide range of environmental conditions.

In the embodiment shown in FIG. 4, the first distance $D_1$ may be larger, such that it may be between 1.5 µm and 250 µm. The second distance $D_2$ may be between 1 µm and 150 µm. The third distance may be between 0.5 µm and 50 µm. In one embodiment, a difference between the first distance $D_1$ and the second distance $D_2$ is greater than 5 µm and less than 50 µm. Similarly, a difference between the second distance $D_2$ and the third distance $D_3$ is greater than 0.5 µm and less than 50 µm. In general, the difference between the first distance $D_1$ and the second distance $D_2$, and the difference between the second distance $D_2$ and the third distance $D_3$ may be greater than x and less than y. In various embodiments, x may be 1 µm, 2 µm, 3 µm, 4 µm, 5 µm, 6 µm, 7 µm, 8 µm, 9 µm, 10 µm, and up to but not including 50 µm. For any of these embodiments y may be 50 µm, 60 µm, 70 µm, 80 µm, 90 µm, and up to 100 µm.

Figure 5:
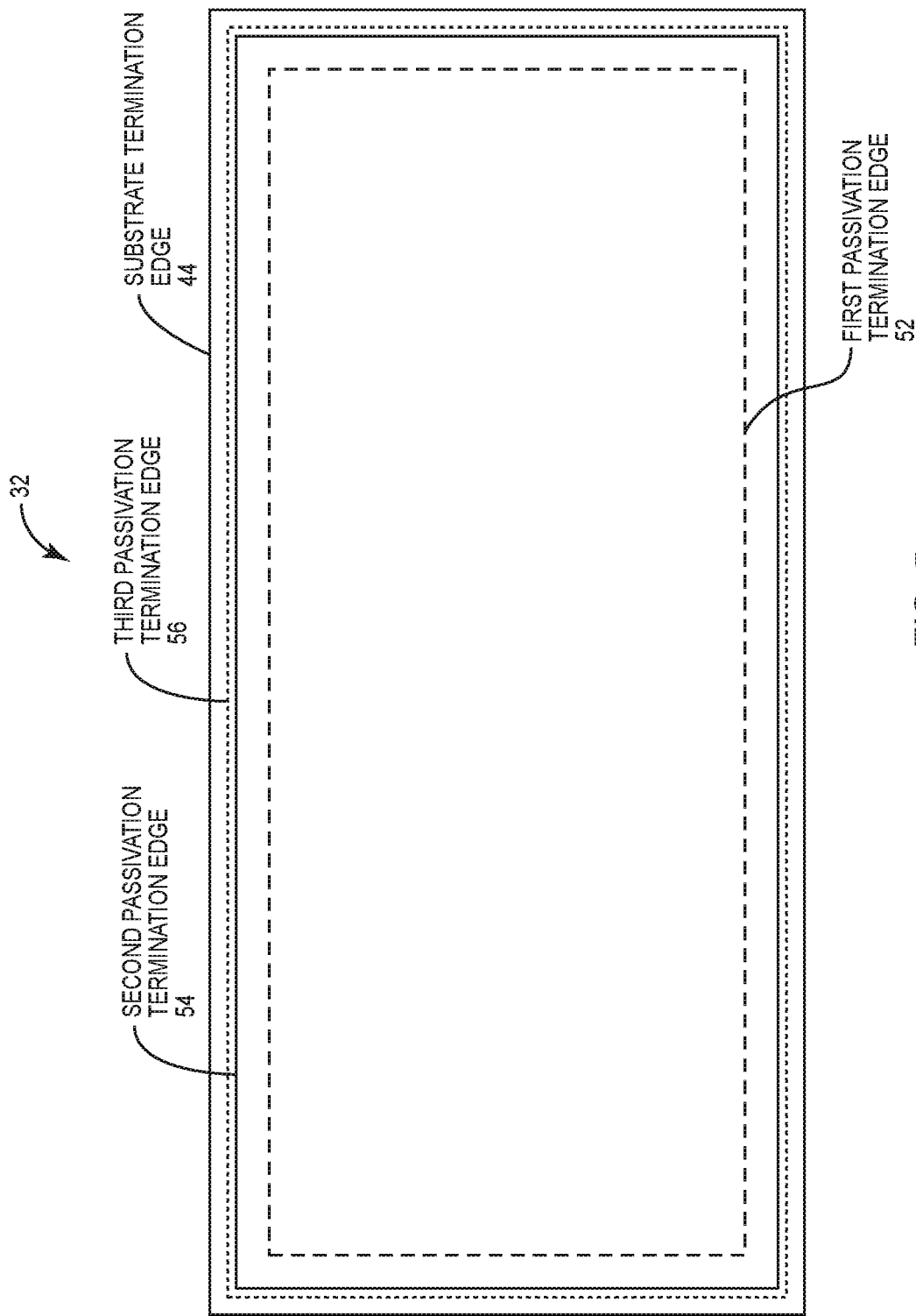

FIG. 5 shows a top-down view of the semiconductor die 32 illustrating the relative positions of the first passivation termination edge 52, the second passivation termination edge 54, and the third passivation termination edge 56 with respect to the substrate termination edge 44 according to one embodiment of the present disclosure. As illustrated, the first passivation termination edge 52, the second passivation termination edge 54, and the third passivation termination edge 56 are inset from the perimeter of the semiconductor die 32 such that the third passivation termination edge 56 is nested inside the substrate termination edge 44, the second passivation termination edge 54 is nested inside the third passivation termination edge 56, and the first passivation termination edge 52 is nested inside the second passivation termination edge 54.

Figure 6:
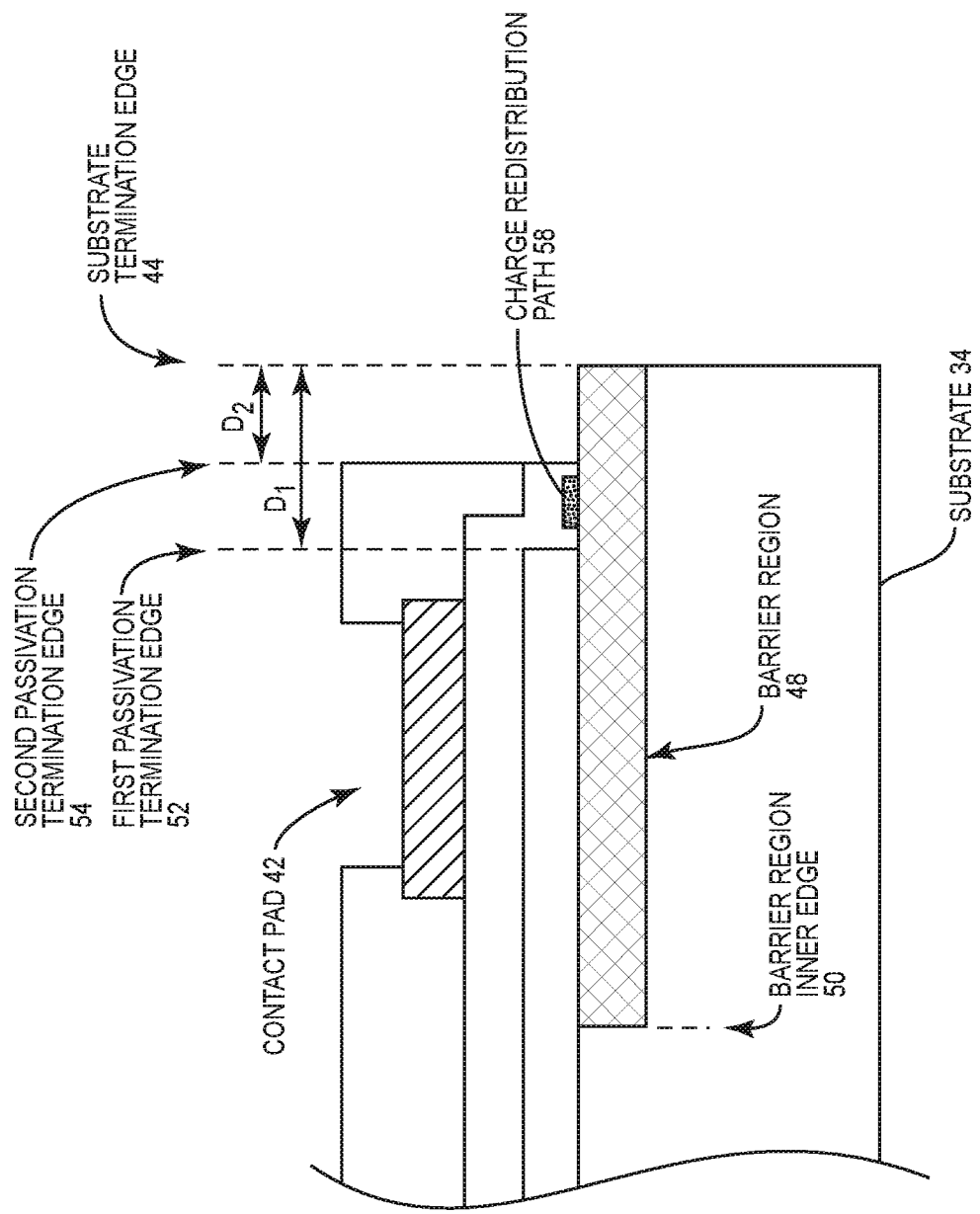

As discussed above, the buildup of an electric field at the termination edge of any of the passivation layers may contribute to moisture and/or ion ingress as it may attract particles towards the active area 46 and thus encourage delamination thereof. In an effort to mitigate this effect, FIG. 6 shows an enlarged view of one side of the semiconductor die 32 shown in FIG. 2 further including a charge redistribution path 58. The charge redistribution path 58 is provided as a metal layer on the substrate 34 between the first passivation termination edge 52 and the second passivation termination edge 54. While not shown, in some embodiments the charge redistribution path 58 may be provided inside the first passivation termination edge 52 or may traverse across the first passivation termination edge 52 and/or the second passivation termination edge 54. In one embodiment, the charge redistribution path 58 may be provided around the perimeter of the semiconductor die 32 and coupled to a fixed potential such as ground.

In addition to mitigating the ingress of moisture and/or ions to the active area of the semiconductor die 32, the charge redistribution path 58 may provide other operational benefits as well. While the charge redistribution path 58 shown in FIG. 6 forms a ring around the perimeter of the semiconductor die 32, the charge redistribution path 58 may be provided in any area in which charge redistribution may be beneficial (e.g., to avoid moisture and/or ion ingress) and thus may be provided in any shape and at any location on the semiconductor die (e.g., over a portion of the active area, bisecting the active area, etc.). In some embodiments, charge redistribution path 58 forms a closed path, while in other embodiments the charge redistribution path 58 may remain open. Further, while the charge redistribution path 58 is shown as a metal layer on the substrate 34 between the substrate 34 and the first passivation layer 36, the charge redistribution path 58 may be provided on the opposite side of the substrate 34 (opposite the first passivation layer 36), on the first passivation layer 36, on the second passivation layer 38, on the third passivation layer 40, or on any other layer without departing from the principles described herein. In various embodiments, the location of the charge redistribution path 58 may be different in different areas of the device. For example, one lateral edge of the semiconductor die 32 may be reserved for gate contacts of semiconductor devices in the active area 46 thereof and thus be referred to as a "gate side," while an opposite lateral edge of the semiconductor die may be reserved for drain contacts of semiconductor devices in the active area 46 thereof and thus be referred to as a "drain side." Since the electric field in these different portions of the semiconductor die 32 may be different, the charge redistribution path 58 may be provided in a first pattern and in a first location on one of the substrate 34, the first passivation layer 36, the second passivation layer 38, the third passivation layer 40, or any other layer on the gate side of the semiconductor die 32 and provided in a second pattern and in a second location on one of the substrate 34, the first passivation layer 36, the second passivation layer 38, the third passivation layer 40, or any other layer on the drain side of the semiconductor die. In general, the particular pattern and location of the charge redistribution path 58 may be different for different areas of the semiconductor die 32, as the field in these different areas may be different and thus may need to be redistributed in different ways to increase the performance of the semiconductor die 32.

Figure 7:
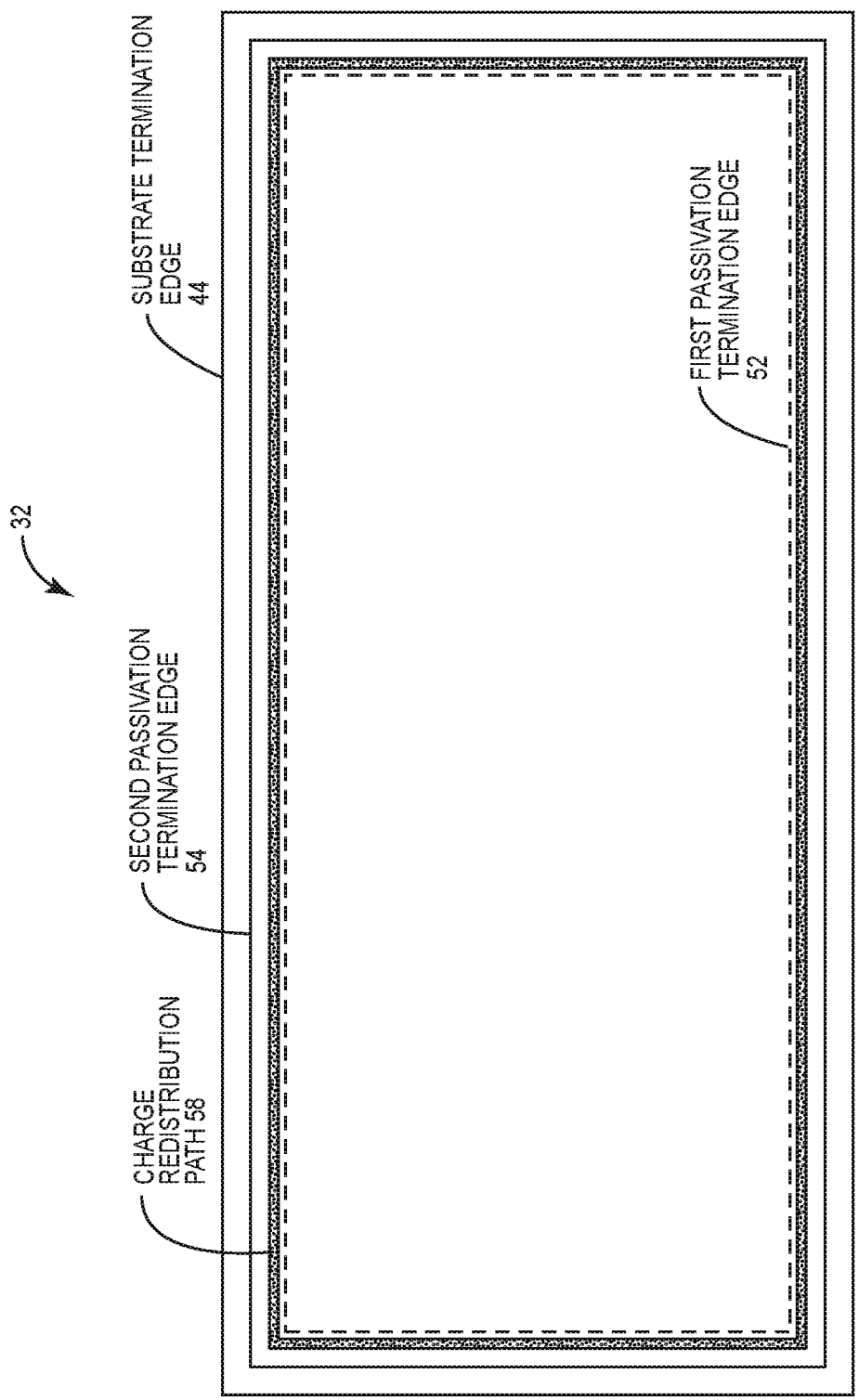

FIG. 7 shows a top-down view of the semiconductor die 32 including the charge redistribution path 58 according to one embodiment of the present disclosure. As shown, the charge redistribution path 58 is inset from the perimeter of the semiconductor die 32 between the first passivation termination edge 52 and the second passivation termination edge 54. Providing the charge redistribution path 58 as shown in FIGS. 6 and 7 reduces the electric field at the first passivation termination edge 52 and the second passivation termination edge 54, which in turn reduces moisture and ion ingress and increases the ruggedness of the semiconductor die 32. The charge redistribution path 58 may be a metal layer comprising aluminum, alloys of titanium, silicon, nickel, and platinum, alloys of titanium, aluminum, nickel, and gold, alloys of titanium nickel, and aluminum, alloys of germanium, nickel, and aluminum, and any other metal system used to make electrical contact to the accompanying active devices.

Figure 8:
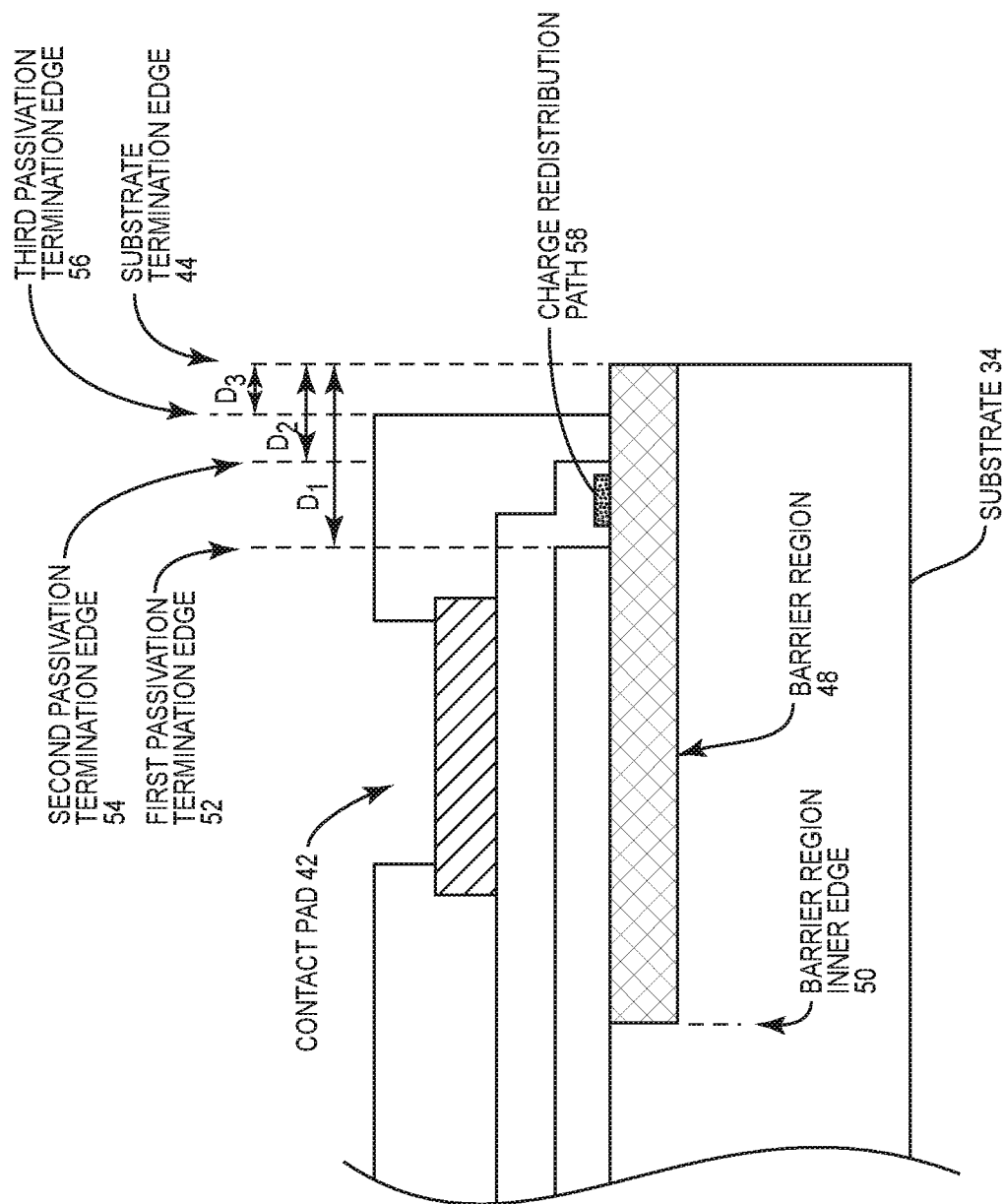

FIG. 8 shows an enlarged view of one side of the semiconductor die 32 shown in FIG. 4 further including the charge redistribution path 58 according to one embodiment of the present disclosure. The charge redistribution path 58 is provided as a metal layer on the substrate 34 between the first passivation termination edge 52 and the second passivation termination edge 54. While not shown, in some embodiments the charge redistribution path 58 may be provided inside the first passivation termination edge 52, may be provided between the second passivation termination edge 54 and the third passivation termination edge 56, or may traverse across the first passivation termination edge 52, the second passivation termination edge 54, and the third passivation termination edge 56. The charge redistribution path 58 may be provided around the perimeter of the semiconductor die 32 and coupled to a fixed potential such as ground.

Figure 9:
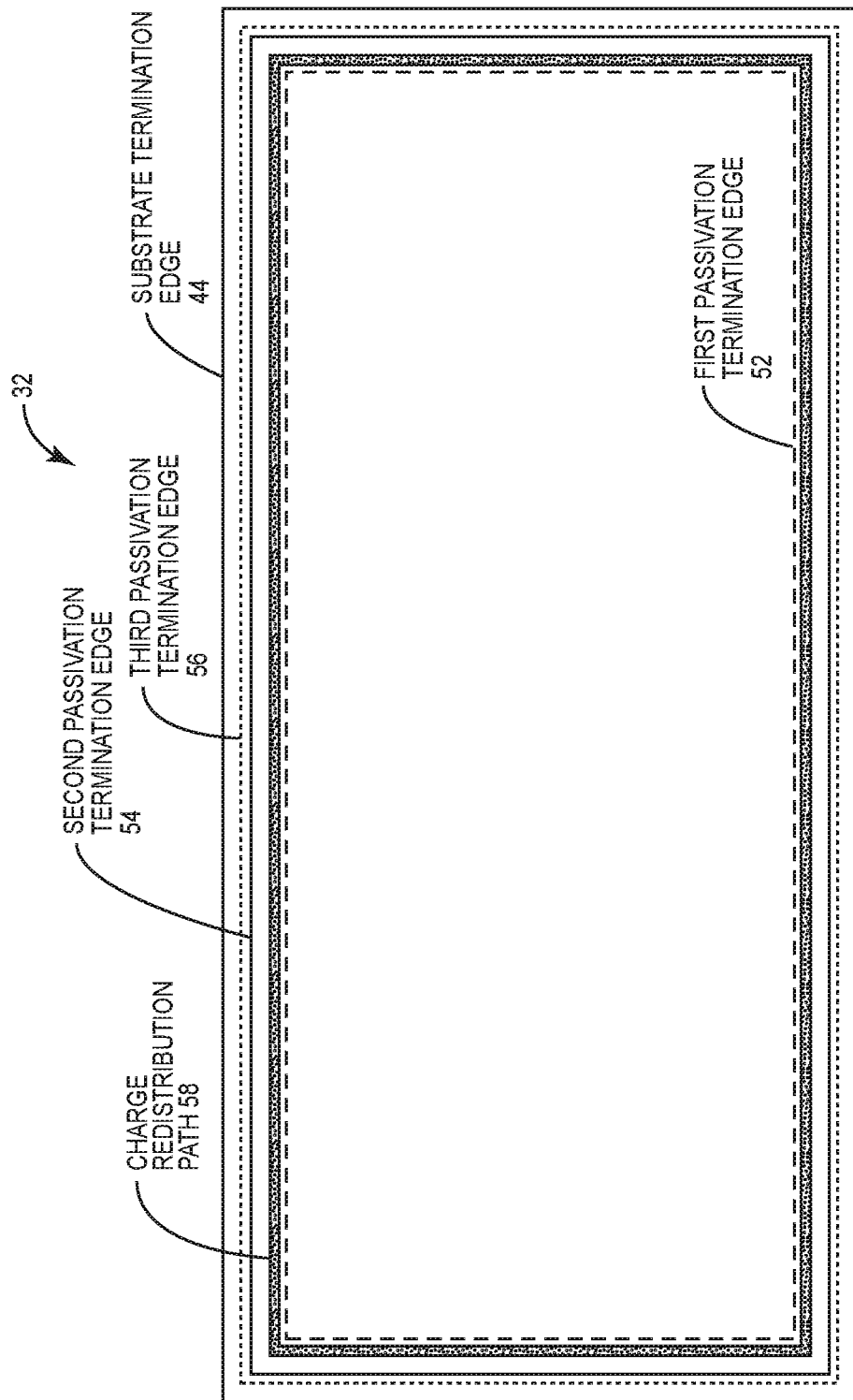

FIG. 9 shows a top-down view of the semiconductor die 32 including the charge redistribution path 58 according to one embodiment of the present disclosure. As shown, the charge redistribution path 58 is inset from the perimeter of the semiconductor die 32 between the first passivation termination edge 52 and the second passivation termination edge 54. Providing the charge redistribution path 58 as shown in FIGS. 8 and 9 reduces the electric field at the first passivation termination edge 52, the second passivation termination edge 54, and the third passivation termination edge 56, which in turn reduces moisture ingress and increases the ruggedness of the semiconductor die 32. The charge redistribution path 58 may be a metal layer comprising aluminum, alloys of titanium, silicon, nickel, and platinum, alloys of titanium, aluminum, nickel, and gold, alloys of titanium nickel, and aluminum, alloys of germanium, nickel, and aluminum, and any other metal system used to make electrical contact to the accompanying active devices.

Figure 10:
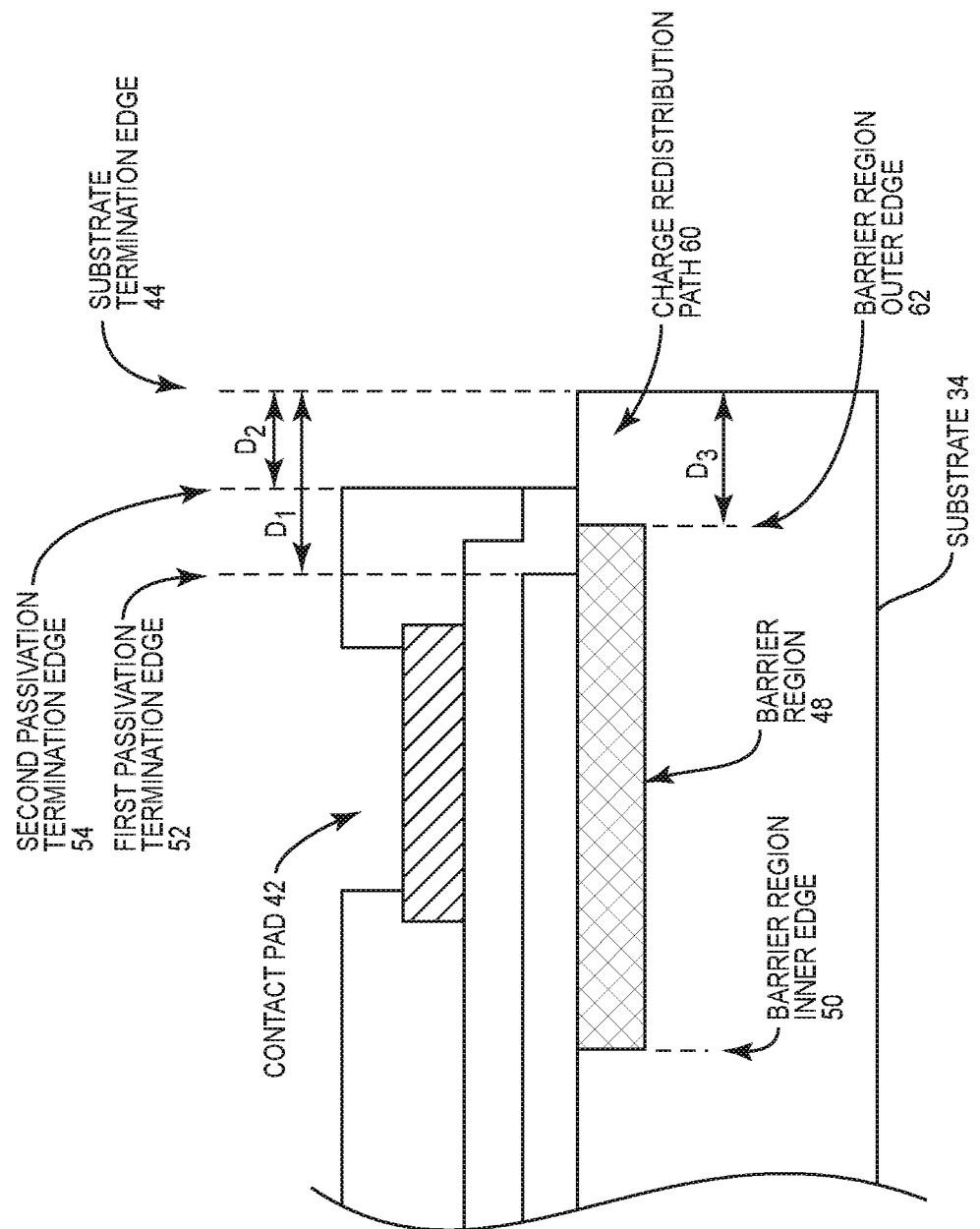

FIG. 10 shows an enlarged view of one side of the semiconductor die 32 shown in FIG. 2 further including a charge redistribution path 60 according to one embodiment of the present disclosure. The charge redistribution path 60 is preferably provided as a conductive (i.e., not implanted or conductively implanted) region of the substrate 34 outside of the barrier region 48. That is, rather than extending between the barrier region inner edge 50 and the substrate termination edge 44, the barrier region 48 extends between the barrier region inner edge 50 and a barrier region outer edge 62, which is inset from the substrate termination edge 44 by a third distance $D_3$. The region comprising the charge redistribution path 60 may in part also be implanted with conductive dopant to have conductivity higher than that of the surface conducting part of the active area. The third distance $D_3$ may be less than the first distance $D_1$ between the first passivation termination edge 52 and the substrate termination edge 44 and more than the second distance $D_2$ between the second passivation termination edge 54 and the substrate termination edge 44. The conductive region of the substrate 34 forming the charge redistribution path 60 may be coupled to ground through the substrate 34 or by a direct contact to a topside grounded or non-zero biased contact pad. For example, the surface conductive region of the substrate 34 may be connected to ground through a contact pad on the backside of the substrate 34 (not shown). This may be achieved by additional masking when implanting the barrier region 48, as discussed below. The charge redistribution path 60 may be provided in any number of shapes and as a closed or open path without departing from the principles herein.

Figure 11:
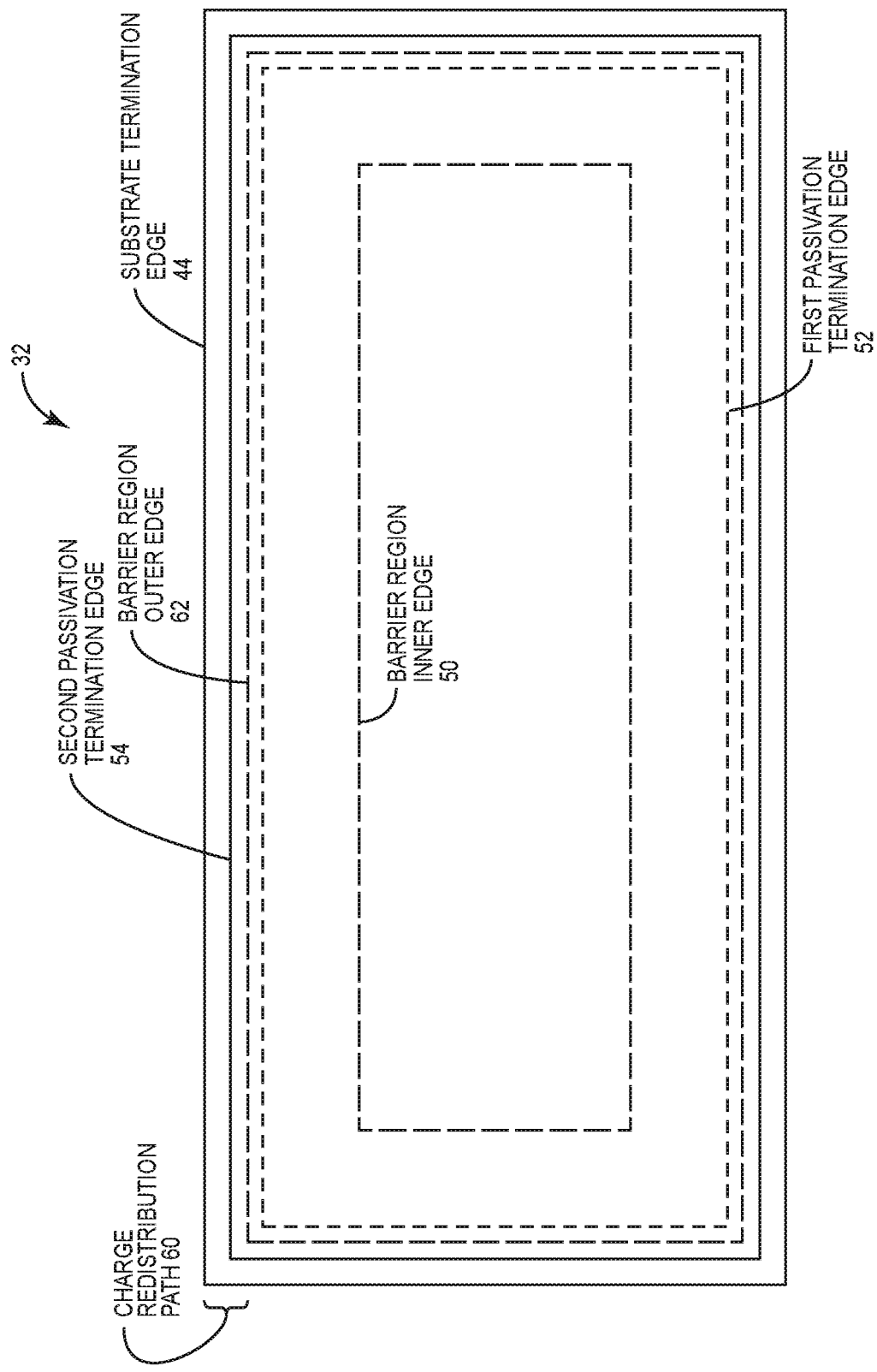

FIG. 11 shows a top-down view of the semiconductor die 32 including the charge redistribution path 60 according to one embodiment of the present disclosure. As shown, the charge redistribution path 60 is on the outside of the barrier region 48 as a conductive or not implanted region. While not shown, the barrier region outer edge 62 may be provided inside the first passivation termination edge 52 (i.e., the third distance $D_3$ may be greater than the first distance $D_1$) or at any other point between the first passivation termination edge 52 and the second passivation termination edge 54. Providing the charge redistribution path 60 as shown in FIGS. 10 and 11 reduces the electric field at the first passivation termination edge 52 and the second passivation termination edge 54, which in turn reduces moisture ingress and increases the ruggedness of the semiconductor die 32. While the charge redistribution path 60 may be a region that is not implanted, it may also be implanted as a conductive region, for example, using silicon (Si), calcium (Ca), Oxygen (O), germanium (Ge), or carbon (C).

Figure 12:
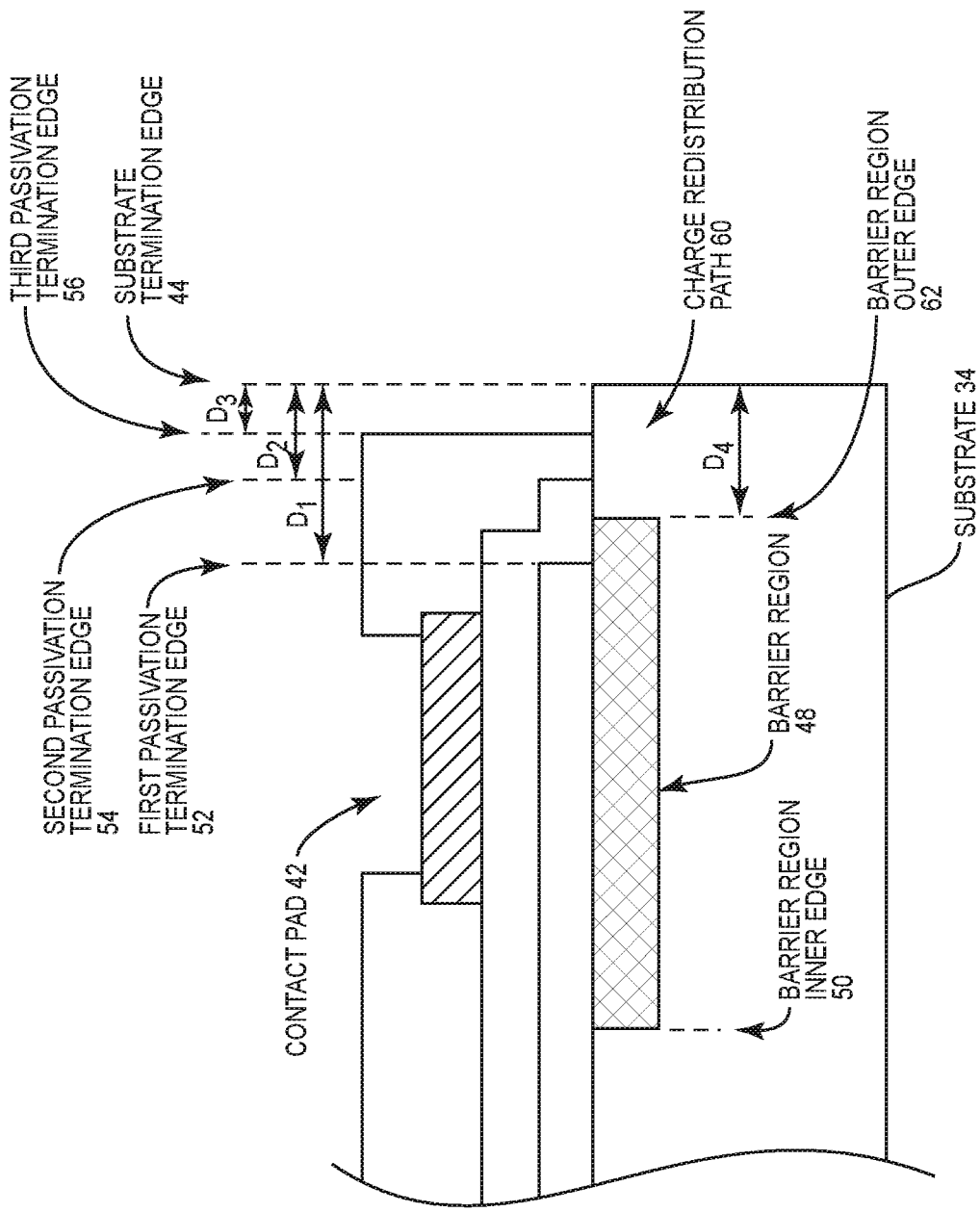

FIG. 12 shows an enlarged view of one side of the semiconductor die 32 shown in FIG. 4 further including the charge redistribution path 60 according to one embodiment of the present disclosure. The charge redistribution path 60 is provided as a conductive (i.e., not implanted) region of the substrate 34 outside the barrier region 48. That is, rather than extending between the barrier region inner edge 50 and the substrate termination edge 44, the barrier region 48 extends between the barrier region inner edge 50 and a barrier region outer edge 62, which is inset from the substrate termination edge 44 by a fourth distance $D_4$. The fourth distance $D_4$ may be less than the first distance $D_1$ between the first passivation termination edge 52 and the substrate termination edge 44 and more than the second distance $D_2$ between the second passivation termination edge 54 and the substrate termination edge 44. The conductive region of the substrate 34 forming the charge redistribution path 60 may be coupled to ground through the substrate 34. For example, the conductive region of the substrate 34 may be connected to ground through a contact pad on the backside of the substrate 34 (not shown).

Figure 13:
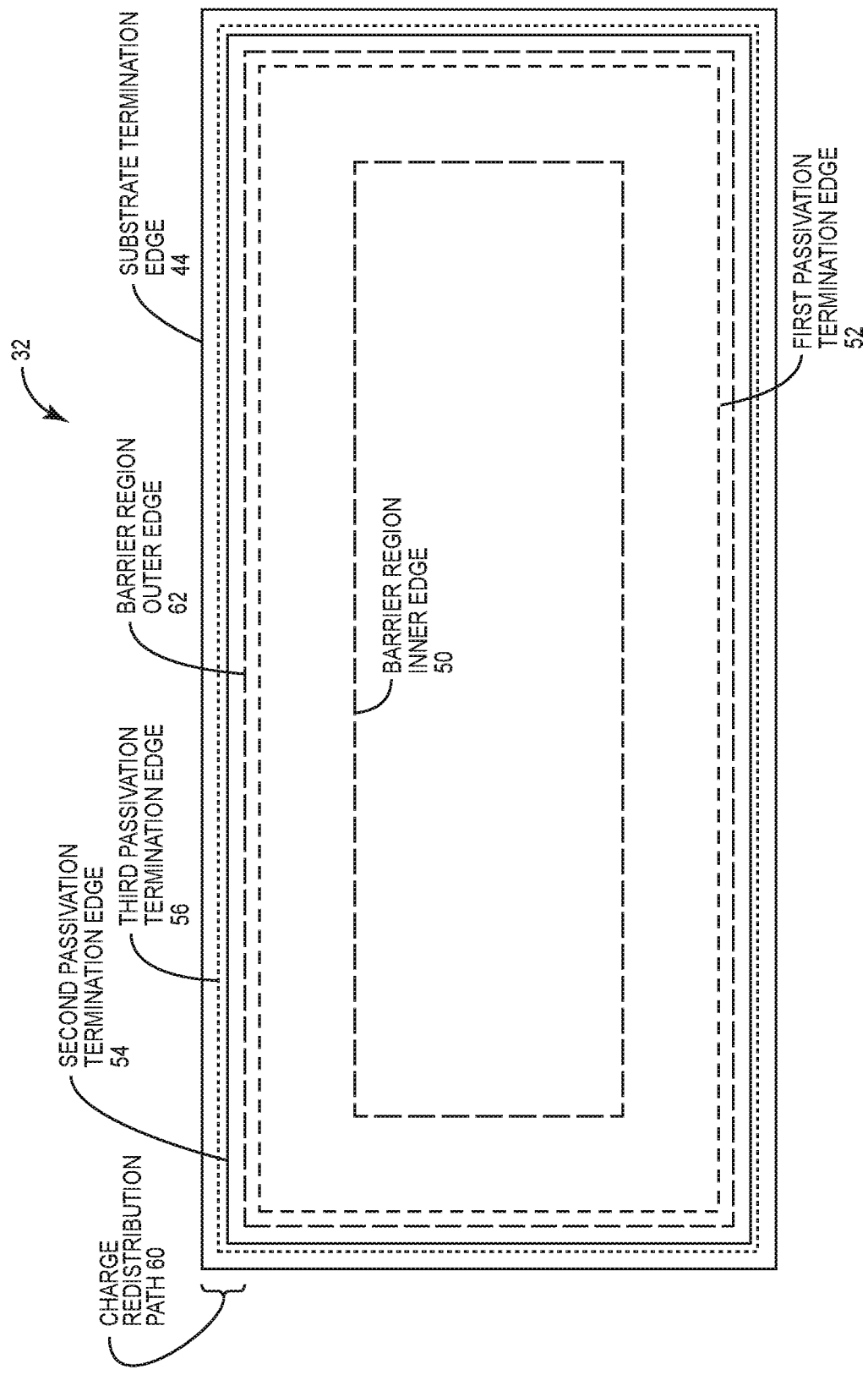

FIG. 13 shows a top-down view of the semiconductor die 32 including the charge redistribution path 60 according to one embodiment of the present disclosure. As shown, the charge distribution path 60 is on the outside of the barrier region 48 as a conductive or not implanted region. While not shown, the barrier region outer edge 62 may be provided inside the first passivation termination edge 52 (i.e., the fourth distance $D_4$ may be greater than the first distance $D_1$), may be provided between the second passivation termination edge 54 and the third passivation termination edge 56 (i.e., the fourth distance $D_4$ may be greater than the third distance $D_3$ and less than the second distance $D_2$), or may be provided at any other point between the first passivation termination edge 52 and the second passivation termination edge 54. Providing the charge redistribution path 60 as shown in FIGS. 12 and 13 reduces the electric field at the first passivation termination edge 52, the second passivation termination edge 54, and the third passivation termination edge 56, which in turn reduces moisture ingress and increases the ruggedness of the semiconductor die 32. While the charge redistribution path 60 may be a region that is not implanted, it may also be implanted as a conductive region, for example, using silicon (Si), calcium (Ca), Oxygen (O), germanium (Ge), or carbon (C).

While the charge redistribution paths are discussed above with respect to semiconductor die, the principles described herein may also be applied to other devices such as monolithic microwave integrated circuits.

Figure 14:
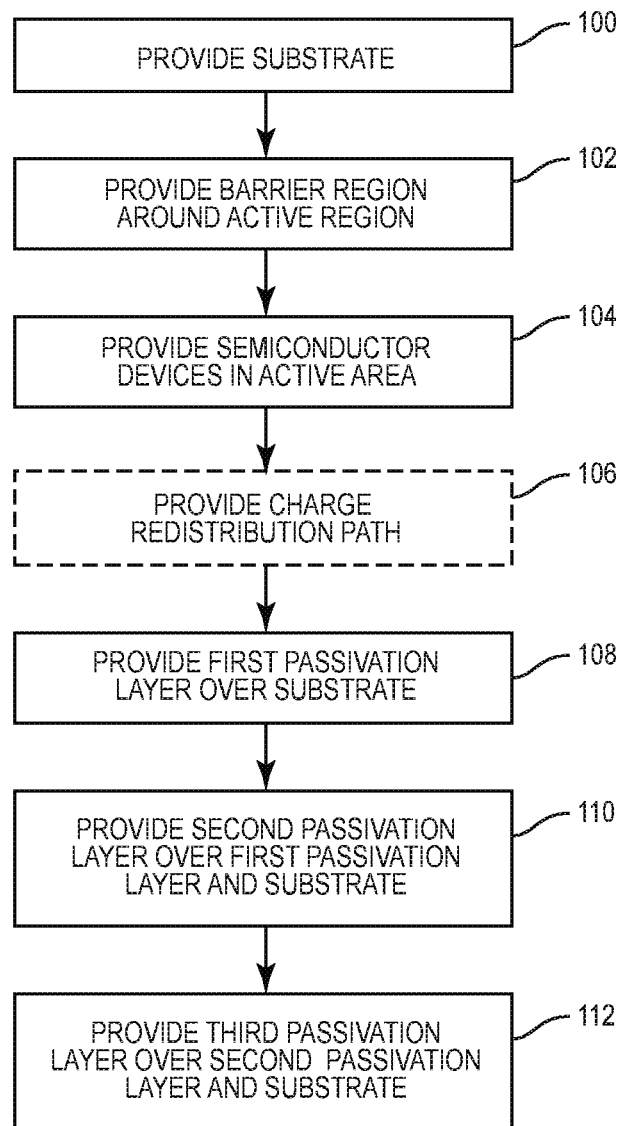
FIG. 14 is a flow chart describing a method for manufacturing a semiconductor die according to various embodiments of the present disclosure.

FIG. 14 is a flow diagram illustrating a method for manufacturing a semiconductor die according to one embodiment of the present disclosure. First, a substrate is provided (step 100). A barrier region is then provided around an active region in the substrate (step 102). This may involve, for example, implanting a region of the substrate such that it is no longer conductive. This may be accomplished by implanting the substrate with nitrogen (N), hydrogen (H), helium (He), magnesium (Mg), zirconium (Zr), krypton (Kr), argon (Ar), and Iron (Fe), but can also be an etched mesa or shallow trench isolation (STI). In embodiments in which a charge redistribution path is provided as a conductive or not implanted region outside the barrier region, this may include additional masking when implanting the barrier region such that it terminates at a barrier region outer edge that is inset from a substrate termination edge. In other embodiments, this may include providing additional implantation outside the barrier region to make this region more conductive. This may be accomplished by implanting the substrate with silicon (Si), calcium (Ca), Oxygen (O), germanium (Ge), or carbon (C). A number of semiconductor devices are then provided in the active area of the semiconductor die (step 104). This may involve, for example, implanting various regions within the active area, providing metal layers for contacts, and other steps that will be appreciated by those skilled in the art. If the charge redistribution path is not provided as a conductive region outside the barrier region, but instead provided as a metal layer on the substrate, the charge redistribution path is then provided (step 106). This may involve masking and depositing a metal layer on the surface of the substrate as discussed above. A first passivation layer is then provided over the substrate (step 108). As discussed above, the first passivation layer may terminate at a first passivation termination edge. A second passivation layer is then provided over the first passivation layer and the substrate (step 110). As discussed above, this second passivation layer may terminate at a second passivation termination edge, which is between the first passivation termination edge and the substrate termination edge such that the second passivation layer overlaps the first passivation layer. The third passivation layer may then be provided over the second passivation layer (step 112). As discussed above, the third passivation layer may terminate at the second passivation termination edge, or may terminate at a third passivation termination edge that is between the second passivation termination edge and the substrate termination edge.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor die comprising:
    a substrate, the substrate comprising boundaries defined by a substrate termination edge;
    a first passivation layer over the substrate, the first passivation layer terminating at a first passivation termination edge that is inset from the substrate termination edge by a first distance; and
    a second passivation layer over the first passivation layer and the substrate, the second passivation layer terminating at a second passivation termination edge such that the second passivation layer overlaps the first passivation layer and the second passivation layer is directly coupled to the first passivation termination edge.

2. The semiconductor die of claim 1 further comprising a third passivation layer over the second passivation layer and the substrate, the third passivation layer terminating at a third passivation termination edge such that the third passivation layer overlaps the second passivation layer.

3. The semiconductor die of claim 2 wherein the substrate comprises:
    an active area in which one or more active devices are provided; and
    a barrier region surrounding the active area and configured to electrically isolate the active area from the substrate termination edge, wherein:
        the barrier region terminates at a barrier region termination edge that is inset from the substrate termination edge; and a charge redistribution path is formed by a region between the barrier region termination edge and the substrate termination edge.

4. The semiconductor die of claim 3 wherein the region forming the charge redistribution path is implanted with dopants to increase a conductivity thereof.

5. The semiconductor die of claim 3 wherein the charge redistribution path is coupled to a fixed potential.

6. The semiconductor die of claim 2 further comprising a charge redistribution path, the charge redistribution path comprising a metal layer under the second passivation layer between the first passivation termination edge and the second passivation termination edge.

7. The semiconductor die of claim 6 wherein the charge redistribution path is coupled to a fixed potential.

8. The semiconductor die of claim 1 wherein the substrate comprises:
    an active area in which one or more active devices are provided; and
    a barrier region surrounding the active area and configured to electrically isolate the active area from the substrate termination edge, wherein:
        the barrier region terminates at a barrier region termination edge that is inset from the substrate termination edge; and
        a charge redistribution path is formed by a region between the barrier region termination edge and the substrate termination edge.

9. The semiconductor die of claim 8 wherein the region forming the charge redistribution path is implanted with dopants to increase a conductivity thereof.

10. The semiconductor die of claim 8 wherein the charge redistribution path is coupled to a fixed potential.

11. The semiconductor die of claim 1 further comprising a charge redistribution path, the charge redistribution path comprising a metal layer under the second passivation layer between the first passivation termination edge and the second passivation termination edge.

12. The semiconductor die of claim 11 wherein the charge redistribution path is coupled to a fixed potential.

13. A method for manufacturing a semiconductor die comprising:
    providing a substrate, the substrate comprising boundaries defined by a substrate termination edge;
    providing a first passivation layer over the substrate such that the first passivation layer terminates at a first passivation termination edge that is inset from the substrate termination edge by a first distance; and
    providing a second passivation layer over the first passivation layer and the substrate such that the second passivation layer terminates at a second passivation termination edge such that the second passivation layer overlaps the first passivation layer and the second passivation layer is directly coupled to the first passivation termination edge.

14. The method of claim 13 further comprising providing a third passivation layer over the second passivation layer and the substrate, the third passivation layer terminating at a third passivation termination edge such that the third passivation layer overlaps the second passivation layer.

15. The method of claim 14 further comprising providing a barrier region in the substrate, wherein the barrier region:
    surrounds an active region in which one or more active devices are provided;
    electrically isolates the active region from the substrate termination edge; and
    terminates at a barrier region termination edge that is inset from the substrate termination edge such that a charge redistribution path is formed by a region between the barrier region termination edge and the substrate termination edge.

16. The method of claim 14 further comprising providing a charge redistribution path as a metal layer under the second passivation layer between the first passivation termination edge and the second passivation termination edge.

17. The method of claim 16 further comprising coupling the charge redistribution path to a fixed potential.

18. A semiconductor die comprising:
    a substrate comprising boundaries defined by a substrate termination edge, the substrate comprising an active area and a barrier region arranged around a perimeter of the active area, wherein the barrier region extends to the substrate termination edge to provide electrical isolation between the active area and the substrate termination edge;
    a first passivation layer over the substrate, the first passivation layer terminating at a first passivation termination edge that is inset from the substrate termination edge; and
    a second passivation layer over the first passivation layer and the substrate, the second passivation layer terminating at a second passivation termination edge such that the second passivation layer overlaps the first passivation layer.

19. The semiconductor die of claim 18, further comprising a third passivation layer over the second passivation layer and the substrate, the third passivation layer terminating at a third passivation termination edge such that the third passivation layer overlaps the second passivation layer.

20. The semiconductor die of claim 18, further comprising a charge redistribution path, the charge redistribution path comprising a metal layer under the second passivation layer between the first passivation termination edge and the second passivation termination edge.

21. The semiconductor die of claim 18, wherein the barrier region comprises an implanted region that extends to the substrate termination edge.

* * * * *